United States Patent [19]

Tully et al.

[11] Patent Number: 4,839,303

[45] Date of Patent: Jun. 13, 1989

[54] PLANAR BIPOLAR TRANSISTORS INCLUDING HETEROJUNCTION TRANSISTORS AND METHOD

[75] Inventors: John W. Tully, Rolling Hills Estates; Benedict B. O'Brien, Manhattan Beach; William Hant, Los Angeles; King L. Hu, Torrance, all of Calif.

[73] Assignee: Northrop Corporation, Hawthrone, Calif.

[21] Appl. No.: 107,617

[22] Filed: Oct. 13, 1987

[51] Int. Cl.⁴ .......................................... H01L 21/265
[52] U.S. Cl. ........................................ 437/31; 437/22; 437/133; 437/944; 148/DIG. 10; 148/DIG. 11; 148/DIG. 72; 357/34
[58] Field of Search ...................... 437/31, 32, 33, 133, 437/126, 22, 184, 228, 944; 357/34, 34 HB, 16; 148/DIG. 10, DIG. 11, DIG. 11 H, DIG. 72

[56] References Cited

U.S. PATENT DOCUMENTS

| | | | |
|---|---|---|---|
| 4,495,010 | 1/1985 | Kranzer | 437/31 |
| 4,531,282 | 7/1985 | Sakai | 437/31 |
| 4,593,305 | 6/1986 | Kurata | 437/31 |
| 4,593,457 | 6/1986 | Birrittella | 437/31 |
| 4,611,388 | 9/1986 | Pande | 437/31 |
| 4,672,414 | 6/1987 | Gabriel | 357/34 |
| 4,731,340 | 3/1988 | Chang et al. | 437/31 |
| 4,751,195 | 6/1988 | Kawai | 437/31 |

Primary Examiner—Olik Chaudhuri
Assistant Examiner—Kevin McAndrews
Attorney, Agent, or Firm—Terry J. Anderson; Robert B. Block

[57] ABSTRACT

A bipolar transistor is constructed to include a substrate, a collector layer epitaxial grown on the substrate and a base layer ion implanted in the collector layer. Next a further epitaxial layer is grown on the collector layer over the ion implanted base layer. A base contact region is ion implanted in this further epitaxial layer between the surface of this further layer and the base layer. The base contact region surrounds and defines an emitter in the further layer. A base ohmic contact is formed on the surface of the further layer in a location overlaying and contacting the base contact region. An emitter ohmic contact is also formed on the surface of the further layer in contact with the emitter. Additionally a collector ohmic contact is also formed on this same surface in a position isolated from the emitter by the base contact region. The collector ohmic makes an electrical contact with the collector by utilizing the further layer as a contact pathway.

18 Claims, 5 Drawing Sheets

▨ ION BOMBARDMENT DAMAGE ISOLATION REGIONS
▨ Be·IMPLANTED AND BASE REGIONS
▨ OHMIC METALLIZATION

PLANAR BIPOLAR TRANSISTORS INCLUDING HETEROJUNCTION TRANSISTORS AND METHOD

CROSS REFERENCE TO RELATED APPLICATIONS

This application is related to applications assigned to the same assignee as this invention and entitled ALUMINUM LIFT OFF MASKING PROCESS AND PRODUCT, Ser. No. 07/107,626, filed in the name of John W. Tully on Oct. 13, 1987, and REFRACTORY METAL OHMIC CONTACTS AND METHOD, Ser. No. 07/107,614, filed in the name of John W. Tully on Oct. 13, 1987, both applications being filed concurrently herewith and the entire contents of both of which are herein incorporated by reference.

BACKGROUND OF INVENTION

This invention is directed to fully planar bipolar transistors including gallium arsenide heterojunction transistors and methods for forming the same and to the use of these transistors in integrated circuit devices.

Since the invention of the transistor refinements have been continually made to reduce both its size and to increase its speed of operation. For many years silicon has been the element of choice utilized to construct transistors and IC devices. Recently silicon based logic gates have been demonstrated having sub-nanosecond speeds down to about 100 picoseconds.

Gallium arsenide was suggested as a potential transistor material long prior to the development of technology allowing the use of gallium arsenide as an actual transistor material. With the advent of liquid phase epitaxy it became possible to construct gallium arsenide transistors. However, since this technology had limitations inherent therein, advances in gallium arsenide transistors lagged behind those being made in silicon base devices.

Heterojunction transistors were also suggested not long after the advent of the transistor. As with gallium arsenide transistors, again the transformation of theory to practical heterojunction transistors has been inhibited by the lack of practical methods for constructing such heterojunction transistors.

Two technologies have emerged which allow for the preparation of both gallium arsenide and heterojunction transistors. These are molecular beam epitaxy, hereinafter referred to as MBE and metal-organic chemical vapor deposition, hereinafter referred to as MOCVD. These two techniques allow the fabrication of gallium arsenide devices and certain heterojunction devices.

In MBE a wafer of a substrate is placed in a reactor which comprises a vacuum chamber. Elements to be deposited upon the wafer are heated to vaporize them and under the control of a mechanical shutter they are released toward the wafer. The vaporized atoms land on the substrate and arrange themselves in an epitaxial layer growing on the substrate. Doping is done by introducing dopant atoms also as a vapor.

As opposed to MBE, in MOCVD generation of a high vacuum is not necessary. In this technique organometallics and hydrides are utilized as carrier molecules and are introduced as gasses into a reaction chamber. Within the chamber the gasses contact a substrate. Atoms are deposited by the gasses onto the substrate to epitaxially grow the desired layers thereon.

Gallium arsenide based logic appears to have an inherent speed advantage of approximately 2 to 5 over silicon base logic. This has led to the development of certain gallium arsenide devices, most particular gallium arsenide FET's, i.e., field effect transistors.

Heterojunction gallium arsenide devices hold the promise of even higher speeds than gallium arsenide devices. Gallium arsenide heterojunction FET's have been demonstrated. Additionally, in order to achieve faster switching speeds, both high electron mobility transistors (HEMT) and certain heterojunction bipolar transistors have been constructed. Both of these devices have the theoretical potential for switching speeds below 20 picoseconds at reasonable low power levels and each only requires optical photolithography in order to build the devices.

Contrary to the heterojunction bipolar devices, the HEMT devices must be cooled to below about 100 K. to achieve optimum performance. Because of this cooling requirement these HEMT devices are not suitable in many environments.

Because of their potential speed and ability to operate at room temperature or higher, bipolar gallium arsenide and bipolar heterojunction gallium arsenide devices are desirable. A further advantage of such bipolar devices is that they can utilize existing libraries of circuit designs which have been developed for emitter couple logic (ECL) or current mode logic (CML) silicon bipolar devices.

Kroemer in a paper H. Kroemer, *Proceedings of the IEEE*, Volume 70, Number 1, January 1982, suggested a heterojunction gallium arsenide device which utilized an inverted emitter architecture. In this device base and collector contacts are placed on one side of a substrate with the emitter placed on the opposite side of the substrate such that it is inverted with respect to the base and collector contacts. However, since the emitter contact is on the opposite side of the substrate from the base and collector contacts this architecture is not applicable to many circuit layouts.

A further heterojunction bipolar gallium arsenide transistor is known which utilizes a normal emitter upright structure. However, in this structure the base layer is continuous across the structure having been formed by epitaxy and is so heavy doped that it cannot be over compensated to enable contacts to be brought to the surface. This, thus requires vias to be formed in the structure. Since via etching is preferential these vias must be oriented at a specific crystallographic direction and generally have retrograded sides. Further, the vias are deep with respect to the dimensions of the individual layers of the device. In view of this, subsequent metallization of the collector contact is difficult, and leads to reduction in the yields of these devices.

BRIEF DESCRIPTION OF THE INVENTION

In view of the above it is evident that there exists a need for new and improved planar bipolar transistors and for devices incorporating these transistors. This invention is directed to new and improved bipolar transistors, integrated circuit devices utilizing these bipolar transistors and processes for the preparation thereof. The processes for the preparation of these devices are useful for the preparation for homojunction devices and particularly useful for the preparation of heterojunction devices including gallium arsenide-gallium aluminum arsenide devices. The preferred process of the invention includes a self-aligning step which reduced base emitter spacing and thereby reduces base emitter and base collector capacitance. Further, the devices are fully planar and therefore do not restrict the layout of metallization runs.

This is achieved in a transistor which has a substrate with a collector layer epitaxially formed on the substrate. A base region is implanted in the collector layer and then a second epitaxial layer is formed over the collector layer including the base region implanted therein. A contact region is implanted in the second layer between the surface of the second layer and the base region. This contact region surrounds and defines an emitter in the second layer. A base ohmic contact is located on the surface of the second layer over and in contact with the base contact region. An emitter ohmic contact is located on the surface of the second layer in contact with the emitter region therein. A collector ohmic contact is located on the surface of the second layer in a position which is isolated from the emitter by the base contact region and makes electrical contact with the collector by utilizing the second layer as a contact pathway. Each of the base ohmic contact, the emitter ohmic contact and the collector ohmic contact lie essentially in a plane.

A plurality of the above planar transistors can be formed on a substrate and isolated on the substrate from one another. The respective ohmic contacts of the individual transistors can then be connected by metallization runs into functional intergrated circuits. These functional circuits are then connected to pins, pads or other connectors for connecting the integrated circuit device to an external environment.

The above transistors can be formed as heterojunction transistors by forming a heterojunction between the first and the second layers as for instances utilizing gallium arsenide for the first layer and overlaying it with a gallium aluminum arsenide layer to form the heterojunction. The base layer can be conveniently formed in the first layer utilizing ion implantation of the dopant ion into the first layer. The second layer can then be epitaxially grown over the first layer either as a homostructure or as a heterostructure.

In a process of the invention a bipolar transistor can be formed by forming at least a first layer on a substrate. A base region is then implanted in a portion of the first layer followed by the formation of a second layer over the first layer including formation of the second layer over the implanted base region in the first layer. A base contact region is then formed in the second layer such that the base contact region extends through the second layer into said base region and makes electrical contact with the base region. As so formed the base contact region isolates a region of the second layer from the remainder of the second layer. An electrical contact to the base contact region is then formed on the surface of the second layer. A further electrical contact to the isolated region is also formed on the surface of the second layer. Additionally a contact to the first layer is also formed on the surface of the second layer utilizing the second layer as a contact pathway to the first layer. This additional contact is formed in a position electrically isolated from the isolated region and its electrical contact.

Both the first and second layers can be advantageously formed utilizing epitaxy. Implantation of the base region into the first layer and implantation of the base contact region into the second layer can be advantageously achieved utilizing ion beam implantation.

Self-alignment of certain elements of these transistors can be achieved by utilizing a further patterning layer over the second layer which includes a pattern of the base contact region. The base contact region is formed through this patterning layer followed by forming the base contact also through the patterning layer. The base contact can be protected by forming a dielectric material over the base contact through the patterning layer. Portions the patterning over the isolated region formed by the base contact region are then removed allowing for utilization of the dielectric material for self-alignment of formation of the electrical contact to the isolated region.

BRIEF DESCRIPTION OF THE DRAWINGS

This invention will be better understood when taken in conjunction with the drawings wherein.

DETAILED DESCRIPTION

For the purposes of illustration of this invention heterojunction bipolar transistors will be described. A gallium arsenide-gallium aluminum arsenide transistor will be utilized for these illustrative purposes. It is recognized that the transistors of the invention, IC devices formed therefrom and the processes of the invention can be utilized for forming other bipolar transistors, as for instance, homojunction transistors including gallium arsenide homojunction transistors.

For the purposes of this specification certain layers in the illustrative heterojunction transistors will be formed utilizing the MOCVD process for formation of epitaxial layers. Alternately, other equivalent technologies such as MBE could be utilized for the formation of these layers. Further, to avoid abrupt heterojunctions and certain anomalies associated therewith, in the formation of heterojunction's of the invention epitaxial growth will be graded from the heterojunction interface through a portion of the heterojunction material as, for instance, grading the aluminum content over the first 500 Angstroms of gallium aluminum arsenide epitaxial layer. The remainder of that layer will then be formed at a constant aluminum content.

Further, for the purposes of illustration of the invention, a NPN device will be illustrated. It is recognized that PNP devices could be formed by suitably doping the component layers of the device.

In a paper authored by one of the inventors of this invention entitled HETEROJUNCTION BIPOLAR TRANSISTORS WITH ION IMPLANTED BASES, J. W. Tully, *IEEE Electron Device Letters*, Volume. EDL-7, No. 4, April 1986, ion implantation of zinc ions in epitaxially grown gallium arsenide layers was demonstrated. After implantation, the zinc implanted capless layer was high temperature annealed. Then, a graded gallium aluminum arsenide emitter layer was epitaxially grown over the zinc implantation and the remainder of the gallium arsenide layer. A gallium arsenide contact layer was then epitaxially grown over the emitter layer. The test wafer was then photolithographically patterned and etched to form a mesa structure with the emitter on top and the collector on the mesa bottom. The emitter metallization was used as a mask and a via etched through the unmasked emitter material down to and revealing the base. The resulting nonplanar transistor was then tested.

These tests demonstrated that zinc ions could be successfully implanted into a first epitaxially grown layer, annealed and then a second epitaxial layer grown over the implantation region. This is in contrast to other heterojunction bipolar transistor processes which rely upon grown base layers which, because they are so heavily doped cannot be over compensated and require deep etch vias to reach the base layers.

Figure 2:
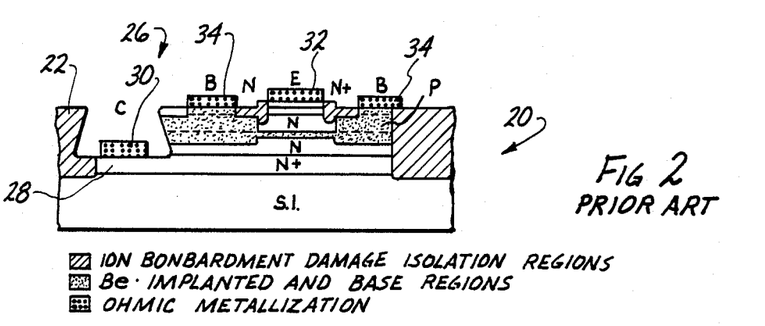
FIG. 2 is a cross sectional view of a prior art normal emitter up nonplanar mesa bipolar transistor.

FIG. 2 shows such a prior heterojunction bipolar transistor generally denoted by the reference numeral 20. Prior to the formation of the device isolation zones, collectively identified by the numeral 22 on either side of the device 20, a p doped base layer 24 extended completely across the wafer. Since this layer 24 is highly doped and cannot be over compensated it requires the formation of via 26 in order to reach the collector layer 28. The collector contact 30 is located at the bottom of the via 26 in contact with the collector layer 28. An emitter contact 32 and base contacts collectively identified by the numeral 34 are elevated with respect to the collector contact 30 and as such the device 20 is a nonplanar device.

Because the etch necessary to construct the via 26 is preferential along specific crystallographic directions the walls of the via 26 are reentrant and are retrograded. This combined with the depth of the via 26 makes metallization of the collector contact 30 very difficult.

Figure 1:
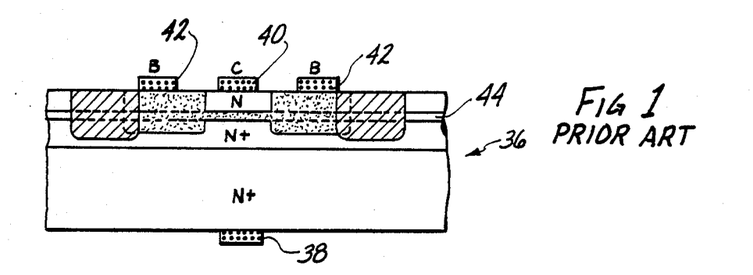
FIG. 1 is a cross sectional view of a prior art inverted emitter bipolar transistor.

A further prior art device generally depicted by the numeral 36 in FIG. 1 utilizes an inverted emitter structure. As is evident from FIG. 1, in the device 36 an emitter contact 38 is on the opposite side of the wafer from a collector contact 40 and base contacts, collectively identified by the numeral 42. By placing the emitter contact 38 in an inverted configuration this bypasses the necessity of using deep vias to get through the base layer 44. However, as a consequence thereof, the emitter contact 38 is located on the opposite side of the device 36 from the collector contact 40 and the base contacts 42.

Referring now to FIGS. 3 through 16, the step wise formation of a transistor of the invention will be shown moving through the respective figures. For these figures a transistor (as both a partially completed structure and as a completed structure) will generally be indicated by the numeral 46. For purposes of brevity of the figures, in certain of the figures not all of the particular layers of the transistor 46 are illustrated.

Further, for purposes of illustration of the transistor 46, the dimension of the particular layers and components formed thereon are not to scale, but in certain instances are exaggerated for clarity of the illustration of the component elements and component layers.

Figure 3:
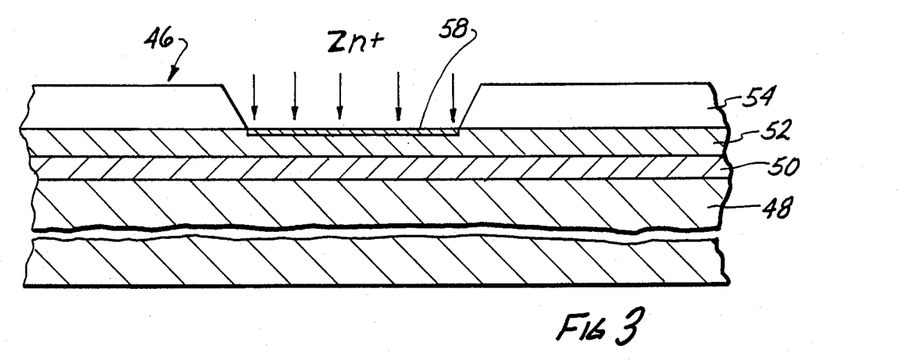
FIG. 3 is a cross sectional view through a prepared semiconductor wafer having certain layers thereon and showing implantation ion pathways.

The first layer depicted in FIG. 3 is a semi-insulating gallium arsenide substrate 48. Suitable for use as the substrate 48 would be a semi-insulating commercially available gallium arsenide wafer of a normal thickness of about 0.0016 inches and polished on both sides such that further layers can be epitaxially grown thereon. The substrate 48 is loaded into an MOCVD reactor and an n+ gallium arsenide subcollector layer 50 is epitaxially grown thereon. Next an n gallium arsenide collector layer 52 is epitaxially grown in the reactor on top of the sub collector layer 50.

For the purposes of certain discussions in this specification and claims attached hereto these two layers 50 and 52 will be collectively identified as the "first layer". Further for the purposes of certain discussions in this specification and claims attached hereto, since this "first layer" includes dopants for electrical activity within the layer, it will also be referred to as an "active first layer".

The collector layer 52 is grown thicker, as for instance 0.1 microns thicker, than is required for the collector because as will be shown below approximately that much material will be utilized in the formation of a base on the collector layer 52.

A resist 54 is located on the collector layer 52 and is patterned at 56 with a window which defines a base ion implant region. Zinc ions are implanted through the window 56 into the collector layer 52 to fom a base layer 58 or "base region". The base layer 58 also can be considered as a "control region" in the above referred to "first layer".

Ion implantation is done in an appropriate ion implantation system at for instance at about 70 keV for zinc ions. The base layer 58 resulting therefrom exhibited high dopant concentration in a thinly doped base region of about 0.12 microns thick. Utilizing this system concentrations of dopant ions of about $3 \times 10^{16}$ cm$^3$ are achieved.

As alternates to the use of zinc ions for base implantation, cadmium, magnesium and beryllium can be suggested. Since beryllium has a lighter mass than zinc it is expected that it will do less damage to the layer being implanted, however, for the base layer 58, it might be more likely to diffuse. Cadmium can be suggested as being more stable under high temperature and because its ion size is larger than that of zinc it might be less prone to diffuse. Zinc, however, is presently preferred for the ion implant of the base layer 58.

After removal of the resist 54, transistor 46 as seen in FIG. 3, is reinserted into a MOCVD reactor where it is high temperature annealed. Presently preferred for this high temperature annealing would be an anneal temperature of about 920° C. for about 5 minutes. This annealing step removes any damage sites within the base layer 58. Such damage sites can contribute to recombination of the carriers in the transistor. Such recombination would detract from the performance of the transistor by destroying gains, density currents, and the like while increasing noise levels and other undesirable effects. The high temperature anneal effectively removes any such damage sites such that they will not be disruptive in performance of the transistor 46.

While the high temperature anneal results in certain loss of the zinc ion dopant concentration, the initial concentration on ion implantation is sufficient such that even after anneal a high ion concentration is present in the base layer 58. As an alternative to the above described capless annealing step, a cap might be used over the base layer 58 during the annealing of the base implant to maintain higher base layer ion dopant concentration during the anneal.

It has been found that a cap of only 135 Angstroms of sputtered silicon nitride ($Si_3N_4$) is sufficient to retain all of the zinc ion implant while still maintaining activation of this implant.

Figure 4:
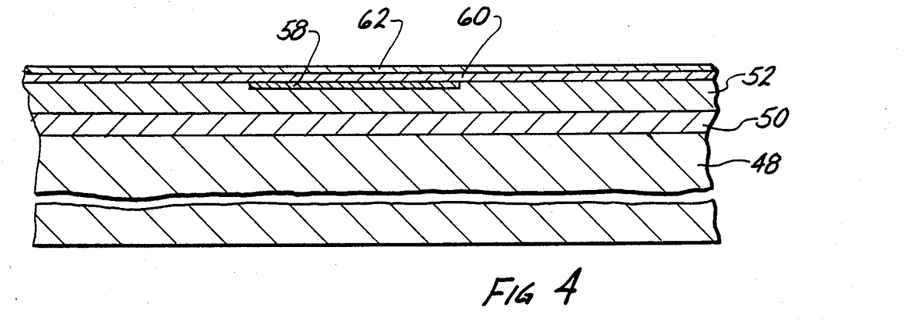
FIG. 4 is a view similar to FIG. 3 showing the wafer after further layers have been added to the wafer.

Referring now to FIG. 4, while still maintaining the transistor 46 in the MOCVD reactor, after formation of the base layer 58 in the collector layer 52 an n gallium aluminum arsenide emitter layer 60 is grown on top of the collector layer 52 and the base layer 58 formed therein. During growth of this gallium aluminum arsenide emitter layer 60, the aluminum concentration is graded over about the first 500 Angstroms of growth from 0 to about 0.30 aluminum content and then for the remainder of the layer the aluminum concentration is maintained at a steady level of about 0.30 aluminum content. The emitter is grown to a thickness of about 0.15 microns and an n+ gallium arsenide contact layer 62 is next epitaxially grown over the emitter layer 60.

Together the emitter layer 60 and the contact layer 62 can be considered as a "second layer" grown over the above referenced "first layer". As noted above the "first layer" comprised the collector layer 52 and the control region or base layer 58 formed therein.

It has been found that the ion implantation of the base layer 58 into the collector layer 52 is not significantly desruptive such that the emitter layer 60 and the contact layer 62 can be epitaxially grown on top of the previously epitaxially grown collector layer 52.

Doping for the all of the above referenced n or n+ type gallium arsenide and gallium aluminum arsenide layers is generally effected utilizing silicon as the dopant atom. Alternatively to silicon other group VI elements with the exception of oxygen can be used. This n type dopant group includes silicon, sulfur, selenium, and tellurium.

Figure 5:
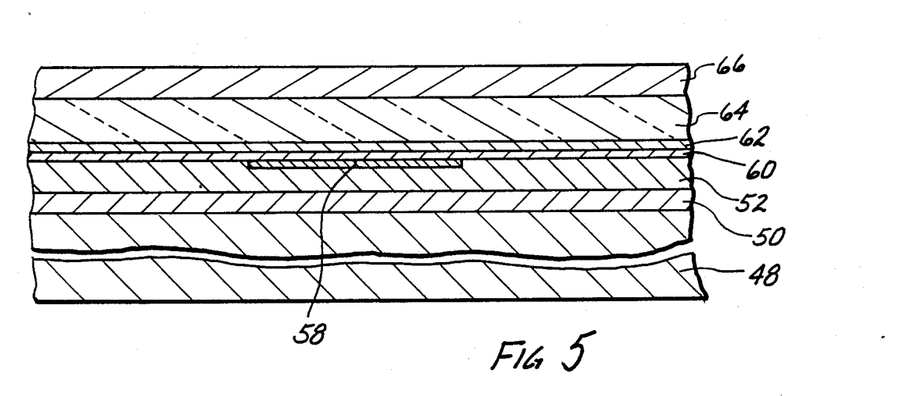
FIG. 5 is a view similar to FIG. 4 except additional layers have been added to the wafer.

Referring now to FIG. 5, next a silicon dioxide layer 64 is sputter deposited on top of the contact layer 62. This is followed by sputter depositing an aluminum layer 66 on top of the silicon dioxide layer 64. These layers are sputter deposited to a thickness of about 0.4 microns each. A photoresist 68 is layered over the aluminum layer 66 and a base contact pattern is photolithographically reproduced in this resist layer 68.

The aluminum layer 66 is etched utilizing a commercial phosphoric acid etch ($H_3PO_4$). The silicon dioxide layer 64 is then RIE etched utilizing a $NF_3/Ar$ etch and the aluminum layer 66 as a mask. This $NF_3$ etch is a quasi anistropic etch at a first pressure which does not cause polymerization and does not react with the aluminum mask.

The silicon dioxide layer 64 is then etched again using an isotropic etch also utilizing $NF_3$ at a higher pressure. This etch is very controllable and can be timed to achieve a controlled 0.2 micron undercut of the aluminum mask. Ultimately, as will be seen below, this 0.2 micron undercut defines the base emitter separation allowing for a base emitter separation of 0.2 microns while utilizing 2 micron photolithography design. Because of this 0.2 micron base emitter spacing a base emitter parasitic diode can be inhibited resulting in improved performance of devices.

For the isotropic etch of the silicon dioxide layer 64 to undercut the aluminum 66, alternately either $NF_3/AR$ or $CF_4/O_2$ can be utilized. Presently it is preferred to use the $NF_3/Ar$ etch since the etching perameters are better controlled using this etch.

Figure 6:
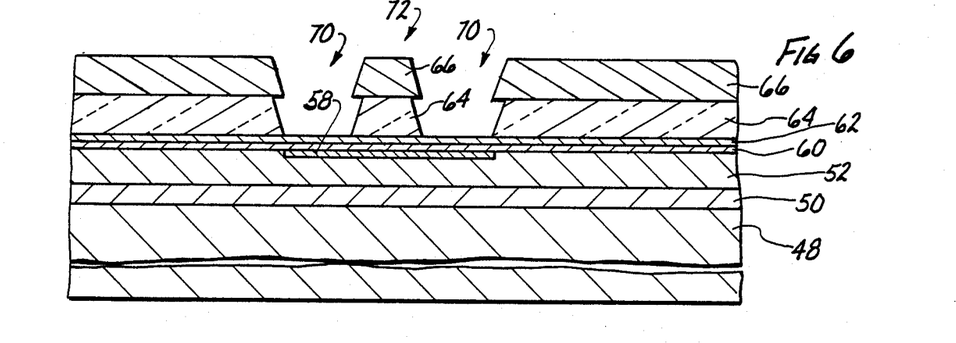
FIG. 6 is a view similar to FIG. 5 showing patterning and removal of areas of the top layers of the wafer.

In FIG. 6, a window 70 has been opened through the aluminum layer 66 and the underlying silicon dioxide layer 64. As seen in FIG. 6, in the sectional view, this window 70 is seen as two separate windows, however, this window is continuous and seen in plan view would appear as a square ring. Located in the center of the window 70 is an island 72 of silicon dioxide overlaid with aluminum which overlays what will ultimately become the emitter of the transistor 46.

Figure 7:
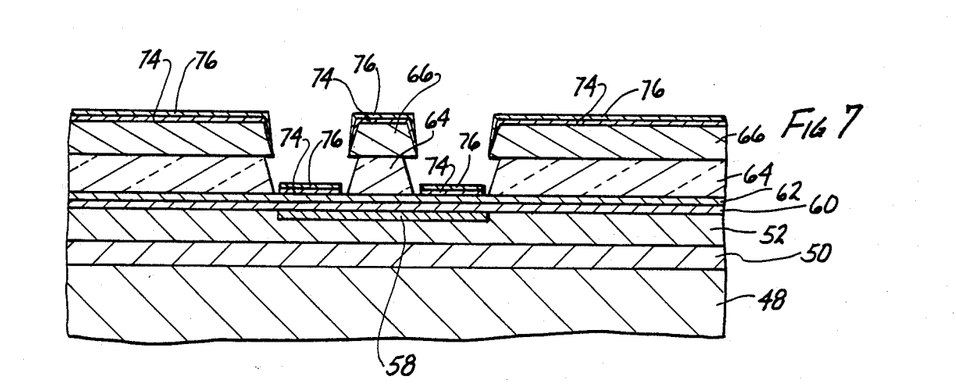
FIG. 7 is a view similar to FIG. 6 showing implantation of material in exposed layers.

Referring now to FIG. 7, base contact metallization for formation of base ohmic contacts are made by E-beam evaporation first of a refractory metal such as molybdenum to form a layer 74 followed by passivation of this metal with a chromium layer 76. The chromium layer 76 serves as a passivation layer against a later $CF_4/O_2$ etch.

Figure 8:
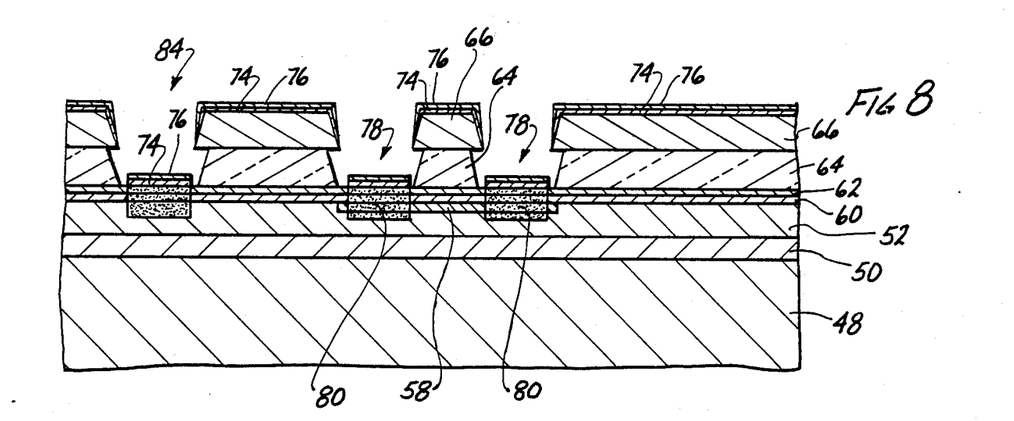
FIG. 8 is a view similar to FIG. 7 showing patterning and exposure of further areas and metallization layers added thereon.

Referring now to FIG. 8, a further ion implantation through the window 70 forms a contact layer or connecting region through the "second layer", i.e. the emitter layer 60 and the contact layer 62, to the buried base layer 58. It thus extends from the "base" or "control zone" up through the "second layer" to the surface of the second layer.

This further ion implantion is done utilizing a beryllium ion implantation which is effected through the molybdenum chromium layers 74 and 76. Alternative to a beryllium ion implantation would be a high energy zinc ion implantation, for instance zinc implantion at 200 keV. However, since the less massive beryllium ions are capable of implanting at a lower energy, beryllium ion implant formation of the contact region to the base layer 58 can be done at a lower energy.

At this time the island 72 protects the material which will ultimately become the emitter. This emitter material lies below the island 72 and is protected during the p type ion implantation such that the emitter material retains its integrity as n type material.

In utilizing beryllium as the implant ion for the base contact region it has been noted that beryllium, since it is a much lighter ion does not induce as great a degree of damage as zinc does and because of its lightness it is implanted at much lower energies. This also reduces damage further. Additionally, we have found that beryllium can exhibit higher $\beta$'s by a factor of about 2 over similar zinc implanted base contact regions.

The molybdenum layer 74 and the protective chrome layer 76 thereon form a base ohmic contact 78. Alternatively to formation of this contact together with ion implantation to connect this contact to the base layer 58, the implantation step can be effected first followed by the formation of the base ohmic contact 78 over it. In any event, a base contact region 80 is formed between the base ohmic contact 78 and the buried base layer 58. As with the window 70 this base contact region 80 is shaped somewhat as a squarish ring.

The base contact 80 serves as a contact or extension region from the surface of the "second layer", i.e. the emitter layer 60 and the contact layer 62, to the buried control region, i.e. the base layer 58. Further, it serves to define an isolated region (located under the island 72) which ultimately will become the emitter of the transistor 46. This isolated region is isolated by the base contact region 80 from the remainder of the "second layer" and thus ultimately the remainder of the "second layer" can be utilized for electrical conduction, i.e. a "conduction pathway", to the buried collector layer, i.e the "first layer", as hereinafter described without affecting the "isolated region", i.e. the emitter, underneath the island 72.

While not forming a portion of the transistor 46, a first layer metallization can be formed on the surface of the second layer, i.e. directly over the contact layer 62 by either concurrently etching with the window 70 or etching in a further step a further window 82. The window 82 is displaced outwardly from the layers which will ultimately form transistor 46 and will ultimately be isolated from it utilizing isolation techniques. If the window 82 is utilized, concurrent with metallization of the molybdenum and chromium layers 74 and 76 a first layer metallization runner 84 can be located in the window 82.

If metallization of the base ohmic contact 78 is done prior to ion implantation of the base contact region 80 and simultaneously with metallization of the base contact 78, a first layer metallization runner 84 is concurrently formed with the ohmic contact 78. During ion implantation to form the base contact region 80 a similar ion implantation would occur underneath the runners 84. Since the runners 84 ultimately will be isolated from other areas on the wafer the ion implantation underneath such runners 84 has little effect and while wo do not wish to be bound by theory, it is believed that it attributes to better performance of the runners 84 by having the implantation area underneath them. In view of this, alternately the metallization for the ohmic contact 78 and the runners 84 can be laid down prior to or after ion beam implantation to form the base contact region 80.

Concurrent with layering of the molybdenum layer 74 and chromium layer 76 in the windows 70 and 82 the molybdenum and chromium are also overlayed on the top surface of the aluminum layer 66. However, because this metallization is done utilizing a thermal evaporation deposit technique, i.e. E-beam evaporation, the metallization is only effective in a straight line directly below the windows 70 and 82 and no metalization is deposited on the undercut sides of the silicon dioxide layer 64 within the window 70 (or the sides of window 82 if they also are formed with an undercut). While we do not wish to be bound by theory, it is also believe that this directional metallization could also be achieved via sputtering.

Because the silicon dioxide layer 64 was undercut via the isotropic etch with respect to the size of the window 70 in the aluminum layer 66 and since the metallization of the molybdenum and chrom layer 74 and 76 is only directly underneath the window 70, the 0.2 micron spacing of the undercut is preserved and it will ultimately form a separation between the base and emitter which will be utilized to reduce the parasitic capacitance of base collector and base emitter.

Figure 9:
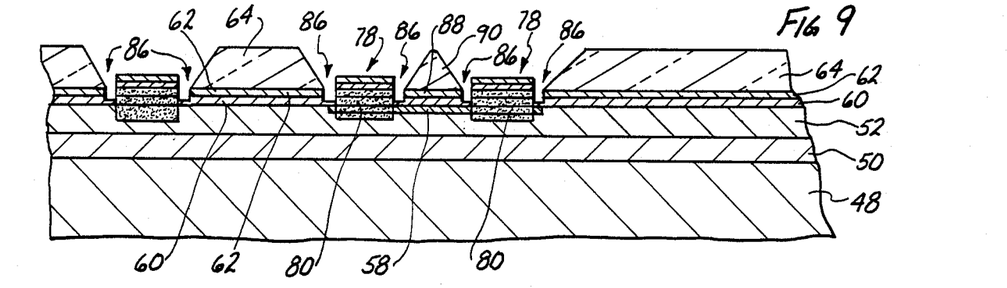
FIG. 9 is a view similar to FIG. 8 showing the removal of the top layer of the wafer.

The aluminum layer 66 is now lifted off of the remainder of the transistor 46. The result of this is seen in FIG 9. Along with lift of the aluminum, any metallization of the molybdenum layer 74 and the chrome layer 76 deposited on the aluminum layer 66 is also removed with the aluminum. The aluminum layer is removed utilizing an etch in 50% potassium hydroxide (KOH). This lift off procedure proceeds very rapidly due to the stress of the Mo/Cr layers. The base ohmic contacts 78 and the metallization runner 84 however, are inert to the KOH etch and it does not effect them. As the aluminum is dissolved the overlying Mo/Cr is floated away. This etch of the aluminum layer is sufficiently fast, occuring in about 5 to 30 minutes, that no significant etching of the gallium arsenide layers occurs.

After liftoff of the aluminum layer and any metallization adhering to the top thereof the separation of the base ohmic contacts 78 from the silicon dioxide layer (i.e. the above referred to 0.2 micron separation) is exposed. The transistor 46 as seen in FIG. 9 is now sputter etched. This does two things. The first of which is to form trenches collectively identified by the numeral 86 through the contact layer 62 and into the emitter layer 60. This opens up an approximate 0.2 micron space between the p type base contact region 80 and the portion of the gallium arsenide contact layer 62 seen in the center of FIG. 9 directly underneath the silicon dioxide pyramid 90 which is separately identified in FIG. 9 by the numeral 88. This breaks an n+ gallium arsenide-p+ gallium arsenide parasite diode formed between the material 88 and the base contact region 80. Breaking of this diode effects the recombination and gain of the device. Alternatively, ion bombardment of these areas can be suggested for breaking such a parasitic diode.

The second thing that happens with the sputter etch is cleaning of the surface by taking down some of the walls of the silicon dioxide layer such that as seen in FIG. 9 compared to FIG. 8 the exposed walls are taken away from a vertical to a more horizontal orientation and they end up with approximately a 45° slope. This will improve later metallization because it is much easier to lay a metallization run over these low sloping walls then higher vertical walls. This avoids thinning out and breaking of the metallization since it does not have to go over a steep wall and is laid down over a more planarized surface.

Figure 10:
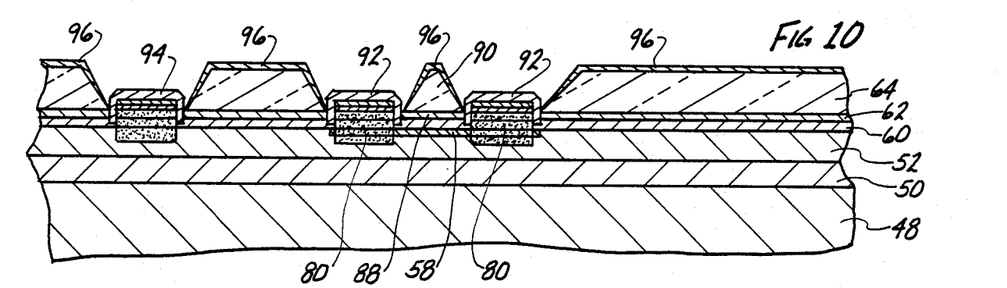
FIG. 10 is a view similar to FIG. 9 showing encapsulation of exposed areas of the wafer.

Next, as seen in FIG. 10 a silicon nitride ($Si_3N_4$) dielectric layer is sputter deposited. The silicon nitride goes down into the trenches 86 and over the base ohmic contact 78 to form caps 92 thereon. Further, at this time it also forms a cap 94 over the metallization runner 84. This passivates the base contacts 78 as well as the metallization runner 84. In filling the trenches 86 with the dielectric silicon nitride, the material 88 in the contact layer 62 is now fully separated by a dielectric material from the base control region 80.

As is also noted in FIG. 10 there is a silicon nitride layer 96 over the surface of the silicon dioxide pyramid 90 as well as over the remainder of the surface of the silicon dioxide layer 64. The pyramid 90 with the layer 96 thereon stands upwardly from the well created in the silicon dioxide layer 64 which houses the base ohmic contact 78 with their cap layers 92 thereon. Advantage is taken of this in the next step as seen in FIG. 11.

Figure 11:
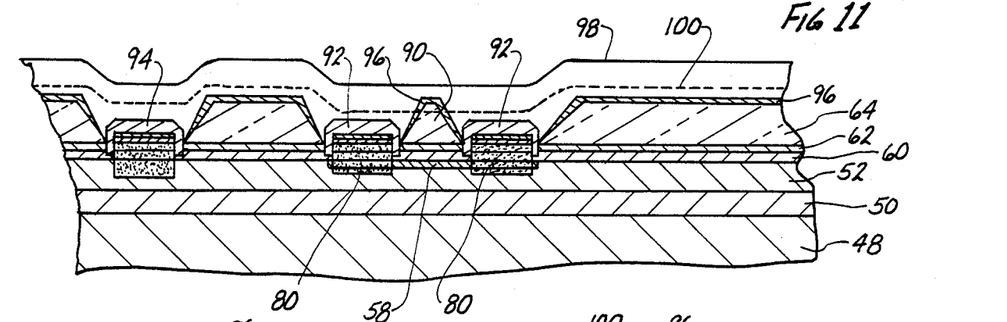
FIG. 11 is a view similar to FIG. 10 showing the addition of material over the wafer.

A layer of a suitable resist as for example a dilute layer of PMMA (polymethyl methacrylate), is overlaid as is defined by the solid line for FIG. 98 in FIG. 11. Prior to overlaying the PMMA as the layer 98, it is thinned utilizing an appropriate commercial thinner for this material such that it will flow across the surface of the wafer. Upon applying the thinned PMMA layer 98 it is allowed to reflow into the well wherein the ohmic contact 78 and the pyramid 90 are located. This layer 98 of PMMA is then RIE etched utilizing an $O_2$ plasma. This erodes the PMMA at a uniform rate no matter where it is on the surface of the wafer.

Because the PMMA was thinned and allowed to reflow, it piled up over the base ohmic contact 78. As it erodes, the top of the pyramid 90 is exposed as is seen in the phantom line 100 of FIG. 11. At this point while silicon nitride layer 96 on pyramid 90 is exposed the silicon nitride caps 92 on the base ohmic contact 78 are still protected by being buried underneath the PMMA. Also the silicon nitride cap 94 on the metallization runner 84 and the silicon nitride layer 96 on the remainder of the silicon dioxide layer 64 are also still buried within the PMMA layer and are protected.

Etching of the PMMA is stopped at a point wherein this layer is still overlays the caps 92 but has exposed the top of the pyramide 90. By utilizing very thin PMMA such that the layer 98 was of the order of about 2500 Angstroms preferential etching of this layer can be achieved.

Figure 12:
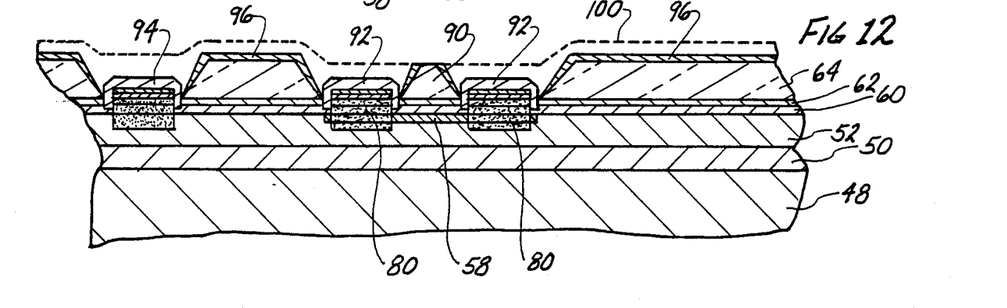
FIG. 12 is a view similar to FIG. 11 showing removal of material exposed after treatment of the layer added in FIG. 11.

A positive photoresist is then applied and the emitter contact area opened in it. A $CF_4/O_2$ plasma is then used to etch away the silicon nitride layer 96 on the pyramid 90. The silicon nitride caps 92 and 94 on the base ohmic contacts 78 and metallization runner 84 and the silicon nitride layer 96 on the remainder of the silicon dioxide layer 96, however are protected from this etch by the PMMA. FIG. 12 shows the results of this etch wherein the silicon nitride top of the silicon dioxide pyramid 90 has been etched away exposing the silicon dioxide material of the pyramid 90.

Figure 13:
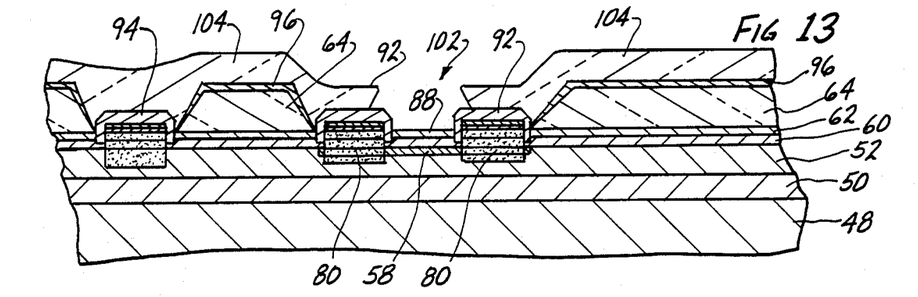
FIG. 13 is a view similar to FIG. 12 showing overlaying of certain portions of the wafer with a resist.

The silicon dioxide of the pyramid 90 is now etched away utilizing a commercial BOE etch which exposes an emitter metalization window area 102 seen in FIG. 13. The remainder of the photoresist and PMMA are then removed and the emitter mask reapplied with a resist. This resist is now treated utilizing a chlorobenzene liftoff process which is known in the literature. This lift off process creates a lip on the resist layer 104 as is seen in FIG. 13. Realignment of the emitter mask at this time is not super critical because of the presence of the silicon nitride caps 102 over the base ohmic contacts 78. These caps 102 make the emitter area self aligning.

As can be seen in FIG. 13 the gallium arsenide contact layers material 88 in the emitter metallization window 102 is exposed with the window 102 being defined by the caps 92 surrounding it. Thus, emitter metallization can proceed in a self aligning step wherein the caps 92 control placement of emitter metallization directly on the material 88.

Figure 14:
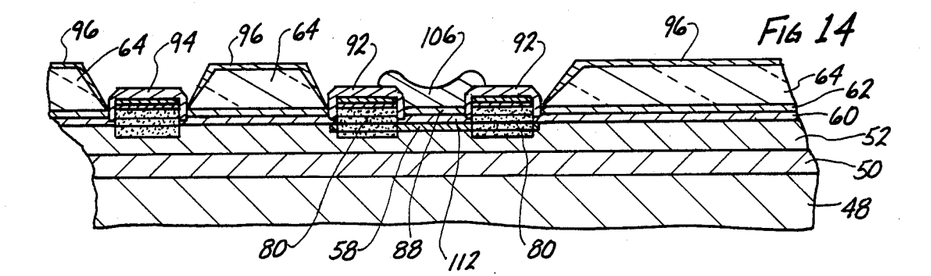
FIG. 14 is a view similar to FIG. 13 showing formation of an ohmic contact on a portion of the wafers.

Emitter metallization is effected to deposit an emitter ohmic contact 106 seen in FIG. 14. This contact is deposited utilizing a gold germanium/nickel/gold layer (AuGe/Ni/Au).

The gold germanium/nickel/gold metallization of the emitter contact 106 is separated from the base ohmic contact 78 by the silicon nitride caps 92 over the base ohmic contact 78. Thus these two contacts are insulated from one another. Exact critical placement of the emitter mask is not necessary because of the self alignment feature achieved by having the silicon nitride caps 92 surrounding the area of the emitter contact 106. Thus, there is a certain degree of variability in the registration of the emitter mask for effecting the metallization of the emitter contact 106.

Next the collector contact is effected. A resist is placed over the surface of the wafer and collector windows are opened in the resist. The silicon nitride layer 96 over the collector layer is etched using a $CF_4$ plasma etch and then the silicon dioxide layer 64 underneath is etched utilizing a BOE etch. This opens a collector window 108 seen in FIG. 15. The silicon nitride edges around this window 108 are then back etched utilizing a $CF_4/O_2$ etch. Collector metallization is then effected also utilizing a gold germanium/nickel/gold layer to lay down a collector ohmic contact 100. The collector metallization 110 and the emitter metallization 106 are then simultaneously alloyed at about 425° C. for 5 seconds.

Figure 15:
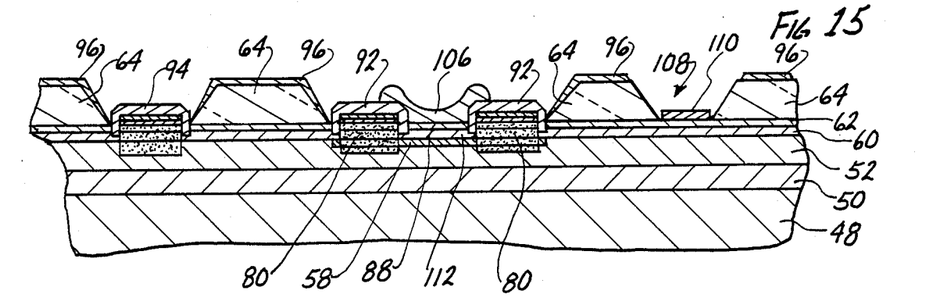
FIG. 15 is a view similar to FIG. 14 showing the formation of further patterning and exposure of additional layers of the wafer.

As is evident from FIG. 15 at this time the planar nature of this process is present. The base ohmic contacts 78, the emitter contact 106 and the collector contact 108 all lie in essentially the same plane. No vias will be necessary on subsequent metallization of these contacts since they in fact all are in the same plane.

The collector contact 110 conducts through the "second layer", i.e. the above noted emitter layer 60 and the contact 62, to the "first layer", that is the gallium arsenide collector layer 52. The "second layer" thus forms a conduction pathway to the "first layer". The actual emitter portion 112 of the layer 60 underneath the metallization 106 is isolated from the remainder of the "second layer", i.e. the layers 60 and 62, by the base contact region 80 which completely surrounds it to isolate it as an island. An NPN bipolar transistor 46 is thus completed between emitter material 112, base layer 58 and collector layer 52. This bipolar transistor is completely different from other known gallium arsenide, gallium arsenide-gallium aluminum arsenide or the like known bipolar transistors in that its ohmic contacts are all in the same plane and are not located either on opposite sides of a wafer or in deep vias.

The transistor 46 thus formed is now isolated from other components by ion bombardment at the areas collectively identified by the numeral 114 to electrically neutralize material between devices. This isolation is effected by proton bombardment utilizing plated gold as a proton mask. Normally a two micron thick layer of gold serves as the mask with proton implantation effected in three doses at energies of 100, 200 and 300 keV to achieve a uniform dose of protons throughout the material. This produces device isolation of greater than $10^7$ ohms. Boron and oxygen can also be suggested as potential elements for the bombardment ions for device isolation.

After or prior to isolating individual transistors, such as a transistor 46 other devices can be also built on the surface of the wafer, as for instances forming a resistor by first utilizing a $CF_4/O_2$ etch of the overlying silicon nitride 96 layer followed by nickel chromium evaporation through a photoresist.

Figure 16:
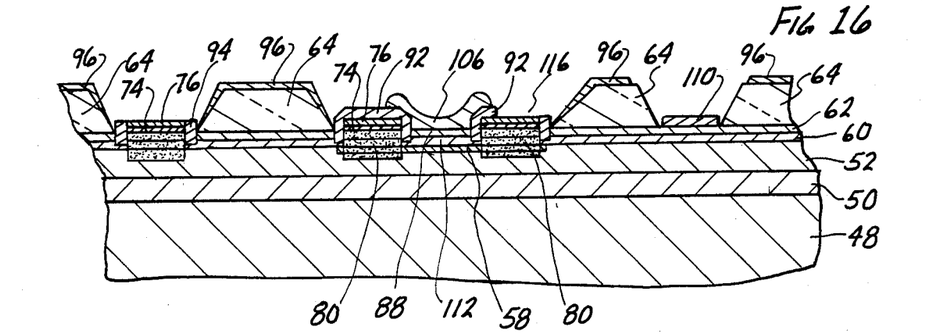
FIG. 16 is a view similar to FIG. 15 showing exposure of additional structures in the wafer.

Base holes in the silicon nitride cap 92 are now open utilizing a $CF_4/O_2$ etch such that the base ohmic material 78 is exposed as is seen at area 116 in FIG. 16. Simultaneously at this time openings 118 are also formed over the metallization runner 84.

Figure 17:
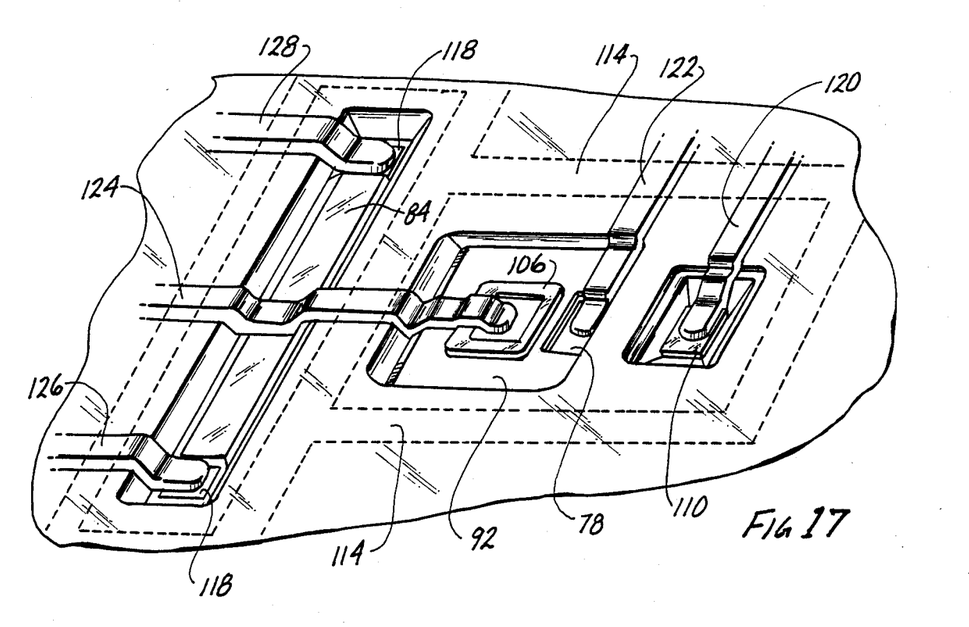
FIG. 17 is an isometric view of the top surface of a wafer having the structure of FIG. 16 located therein.

Referring now to FIG. 17, the base contact area 116 exposes the top of the base ohmic contact 78 and openings both collectively identified by the numeral 118 expose the metallization runner 84. Circuit metallization is now effected to connect the transistor 46 to functional circuits on the wafer. Thus, the collector is connected to circuits via metallization run 120, the base via metallization run 122 and the emitter via metallization run 124. Further metalization runners 126 and 128 are connected to the buried metallization runner 84. Useful for metallization runs 120, 122, 124, 126 ad 128 would be titanium gold or the like. This is put on utilizing a suitable mask and resist.

As seen in FIG. 17 the metallization run 124 crosses over the buried metallization runner 84. Thus, also inherent in the device of the invention is both a first metallization layer, i.e. the runner 84, which is inherently isolated from a second layer of metallization, i.e. the runners 120 through 128. This facilitates formation of circuit element designs in integrated circuits which are fabricated utilizing a plurality of transistors 46, each formed in equivalent manner as described and interconnected into functional integrated circuits on a wafer including additional elements such as nickel chromium resistors and the like. Bridges are automatically created over molybdenum chromium metallization runners which are buried and which are simultaneously formed when the base ohmic content 78 was formed.

Heterojunction bipolar transistors utilizing the above structure and processes have been implemented into a variety of integrated circuit devices such as ring oscillators, dividers and the like without the use of deep vias and without regard to crystalographic orientation in their preparation.

As is evident in FIG. 17, the trench 86 shown in phantom line in FIG. 17 completely isolates the emitter located under emitter metallization 106 from the base area which is located underneath the base silicon nitride caps 92.

Alternately to isolating the emitter as an "island" in the base as has been described, the emitter could be located on one side of the base and then isolated by ion bombardment around the remainder of its periphery. Such a construction would also serve to isolate the emitter from the remainder of the "second layer" material allowing this "second layer" material to serve as the conduction pathway to the collector. Suitable ion bombardment would be proton bombardment as described above.

Finally, to complete an integrated circuit device an appropriate wafer having transistors as per the transistors described above would be trimmed, mounted in an appropriate support structure and equipped with pins, pads or other similar connectors utilized to connect the integrated circuit device to its outside working environment.

The transistor described above was able to achieve a 0.2 micron spacing between the emitter base while still utilizing photolithographic processes relying on line spacing of 2 microns, i.e. 2 micron design rules. The self aligning of the emitter base allows this to be possible while still working well within the realm of optical lithographic processes. Thus, as noted in the examples below, utilizing 2 micro design rules, a 2.5 micron×2.5 micron emitter devices is constructed. Utilizing 1 micro design rules, as 1 micron×1 micron emitter device can still be constructed utilizing optical lithographic processes. A log reduction in size of the line spacing can be suggested utilizing electron lithographic processes.

Further, the device of the invention have an inherent second level of metallization built in and the top metallization utilized to connect the devices in circuits and the like need only traverse plateaus, i.e. the edges of the silicon dioxide, which are of an order of 3,000 to 5,000 Angstrom instead of in the micrion domain and which might also include having to traverse micron domain retrograde walls.

Gallium arsenide and gallium arsenide-gallium aluminum arsenide bipolar transistors have been utilized for illustrative purposes herein. Other group III–group V materials might also be used for the construction of transistors of the invention. Thus with aluminum and gallium, indium can be suggested as a further group III material and with arsenic, phosphorus and antimony as further group V materials.

EXAMPLE 1

A 0.0016 inch thick semi-insulated gallium arsenide wafer polished on both sides was loaded into a MOCVD reactor (Crystal Specialties Model 410A). A gallium arsenide subcollector layer was epitaxially grown thereon to a thickness of about 0.5 microns. During growth of this layer it was doped with silicon at about $3 \times 10^{18}$ cm$^3$ to create an n+ gallium arsenide layer. A collector layer was then epitaxially grown to a thickness of about 0.6 microns. The collector layer was doped with silicon at about $1.5 \times 10^{16}$ cm$^3$ to form an n gallium arsenide collector layer. After placing a layer of photoresist on the wafer and exposing it to open up the base windows, the wafer was transferred to a commercial ion implant device and zinc ions were implanted at room temperature to a concentration of about $3 \times 10^{18}$ cm$^3$ and to a depth of about 0.12 microns. This implantation was done at 70 keV utilizing the photoresist to define the window for the base layer.

The photoresist was removed and the wafer reinserted into the MOCVD reactor. It was annealed at 920° C. for 5 minutes immediately followed by the growth of a gallium aluminum arsenide layer to a thickness of about 0.15 microns. The initial 500 Angstroms of this layer was graded in aluminum content from 0.0 to 0.30 aluminum content. This layer was also doped with silicon ions to a dopant concentration of $1 \times 10^{18}$ cm$^3$ to form an n gallium aluminum arsenide layer. Next a gallium arsenide contact layer was grown to about 0.15 microns at a silicon dopant concentration of $3 \times 10^{18}$ cm$^3$.

The wafer with the epitaxially grown layers and ion implanted areas thereon is now sputter deposited first with a layer of silicon dioxide and then a layer of aluminum each to about a thickness of 4,000 Angstroms. A base pattern is then defined with photoresist and the aluminum etched in a commercial phosphoric acid etch. The silicon dioxide is first etched with a NR$_3$/Ar etch at 0.2 torr using the aluminum mask and then an isotropic re-etch utilizing NF$_3$/Ar at 0.35 torr for a time period to achieve a controlled 0.2 micron undercut of the aluminum mask. Since this second isotropic etch is quite slow the etch is simply timed and checked by a scanning electron microscope to achieve the desired 0.2 micron undercut.

Base contact metallization is then effected utilizing a commercial E-beam evaporator. The substrate wafer was preheated in the evaporator to 140° C. for one half hour. Molybdenum was then evaporated to a thickness of about 400 Angstroms followed by evaporating a layer of chromium over the molybdenum to a thickness of about 500 Angstroms.

The wafer was then transferred back to the ion implant chamber and a beryllium ion implant effected at 35 keV at room temperature to form the base contact to the base layer doped at $3 \times 10^{19}$ cm$^3$ in the gallium arsenide layer and $2 \times 10^{19}$ cm$^3$ in the gallium aluminum arsenide layer.

The aluminum layer and extraneous molybdenum chromium located on the aluminum is then lifted off utilizing a 50% KOH/H$_2$O solution. This is completed within about 30 minutes.

The wafer was then sputter etched to form trenches adjacent to the base contact regions and to plane remaining silicon dioxide edges to a more horizontal slope. This was followed by silicon nitride sputter deposition including filling of the trenches with silicon nitride. The berillium ion implant was then rapidly annealed at 800° C. for 5 seconds.

A dilute PMMA layer was then spun onto the surface of the wafer to a thickness of about 2500 Angstroms and allowed to reflow in the areas over the base contacts. The PPMA layer was then RIE etched in an oxygen plasma atmosphere. A positive photoresist was applied and emitter contacts opened in it. The silicon nitride layer over emitters was then plasma etched in a CF$_4$/O$_2$ plasma followed by etching of exposed silicon dioxide in a BOE etch. Emitter metallization was completed utilizing gold germanium/nickel/gold followed by lift off of the excess metal by soaking in acetone to lift the metal off on top of the photoresistant mask. Base contacts were then annealed at 450° C. at 5 seconds in a halogen rapid thermal annealing unit (a RTA device).

A resist was laid over the wafer and collector windows opened through the resist. These windows were etched utilizing a CF$_4$/O$_2$ plasma to etch off the silicon nitride followed by a BOE etch of the exposed underlying silicon oxide. Collector contacts were then applied utilizing evaporation of gold germanium/nickel/gold and both the collector and the emitter contacts alloyed at 425° C. for 5 seconds in RTA device.

Individual devices were then isolated by proton implantation at 100, 200 and 300 keV utilizing a 2 micron thick gold mask to protect the individual devices. Device interconnection metallization was evaporated by utilizing titanium gold evaporated through an appropriate photoresist mask.

EXAMPLE 2

An IC device was fabricated by fabricating individual transistors utilizing the process of Example 1 above. In this device the emitter was $2.5 \times 2.5$ microns square. It showed a differential gain ($\beta$) of 25 to 50 at base currents of 0.1 mA. Emitter and collector resistance were approximately $5 \times 10^{-6}$ ohm-cm$^2$. Base resistance was $5 \times 10^{-7}$ ohm-cm$^2$. Gate delay was approximately 115 picoseconds as measured on a 17 stage ring oscillator. A divided by 2 IC device was operated at from about 30 MHz to about 1850 MHz with a power consumption of about 240 milliwatts.

The invention illustrated in the drawings and described in this specification utilizes certain principles and/or concepts as are set forth in the claims appended hereto. Those skilled in the material science and electronic arts to which this invention pertains will realize that these principles and/or concepts are capable of being utilized in a variety of embodiments which may differ from the exact embodiments utilized for illustrative purposes herein. For this reason, this invention is not to be construed as being limited to only the illustrative embodiments, but is to be construed in view of the claims.

We claim:

1. A process of forming a bipolar transistor on a semiconductor substrate made of Group III-Group V semiconductor materials forming an active first layer thereon comprising:

implanting an ion dopant into a portion of said first layer to form a base region;

annealing said base region to remove damage sites resulting from the implantation and to activate implanted dopant;

forming a second active layer over said first layer including said implanted base region in said first layer;

forming a base contact region in said second layer such that said base contact region extends through said second layer into said base region and makes electrical contact to said base region, said base contact region formed so as to isolate a region of said second layer from the remainder of said second layer, forming on the surface of said second layer a first electrical contact to said base contact region;

forming on the surface of said second layer a second electrical contact to said isolated region; and forming on the surface of said second layer in electrical isolation from said isolated region a third electrical contact to said second layer which electrically conducts to said first layer through said second layer;

whereby said first, second, and third contacts are coplanar on said surface of said second layer.

2. The process of claim 1 wherein:
said first and said second layers are formed of materials capable of creating a heterojunction between said first and second layers.

3. The process of claim 1 including:
forming a plurality of said transistors on said substrate;
isolating said plurality of transistors from one another on said substrate; and
interconnecting said electrical contracts of said plurality of transistors into functional integrated circuits.

4. The process of claim 1 further including:
ion implanting said base contact region into said second layer; and
annealing said doped base contact region.

5. The process of claim 1 in which said semiconductor substrate is GaAs or GaAlAs, and further including the steps of
epitaxially forming said second layer over said first layer including said base region formed therein.

6. The process of claim 1 including:
epitaxially forming said first layer on said substrate;
ion implanting said base region into said epitaxially formed first layer;
annealing said ion implant;
epitaxially forming said second layer over said first layer including said base region formed thereon.
ion implanting said base contact region into said second layer; and
annealing said base contact region ion implant.

7. The process of claim 6 further including;

forming a least one further layer on said second layer prior to ion implanting said base contact region;

patterning said further layer with a pattern for said base contact region;

ion implanting said base contact region through said pattern and annealing said base contact region;

forming said electrical contact to said base contact region through said pattern; and covering said base contact region electrical contact with a dielectric material through said pattern.

8. The process of claim 7 further including:

patterning said further layer with at least one additional metallization pattern;

forming a metallization run corresponding to said metallization pattern in conjunction with forming said electrical contacts to said base contact region; and covering said additional metallization run with said dielectric material in conjunction with covering said base contact region electrical contact with said dielectric material.

9. The process of claim 7 further including:

utilizing said dielectric material covering base contact region electrical contacts as a self aligning mask for forming said isolated region electrical contact.

10. The process of claim 1 including:

forming said isolated region as a transistor emitter; and forming said first layer as a transistor collector.

11. The process of claim 1 including:

forming said first layer as a gallium arsenide layer; and forming said second layer to include at least a gallium aluminum arsenide sub-layer, said gallium aluminum arsenide sub-layer overlaying said gallium arsenide first layer.

12. A process of forming an integrated circuit device comprising:

providing a Group III–Group V semiconductor substrate;

forming at least a first active layer on a substrate;

implanting an ion dopant into a plurality of base regions in said first layer;

annealing said base region to remove damage sites resulting from the implantation;

forming a second active layer over said first layer including said implanted base region in said first layer, said second layer including a surface;

forming a base contact region in said second layer over each of said base regions such that said base contact regions extends through said second layer into their respective base regions and make electrical contact to their respective base regions, said base contact regions formed so as to each isolate a region of said second layer from the remainder of said second layer, forming on said surface of said second layer a first electrical contact to each of said base contact regions;

forming on said surface of said second layer a second electrical contact to each of said isolated regions;

forming on said surface of said second layer in association with each of said base contact regions a third electrical contact to said second layer which is in electrical isolation from said isolated region and is associated with said respective base contact region and which conducts to said first layer through said second layers;

isolating each of said base regions and their associated base contact region, isolated region, base contact region electrical contact, isolated region electrical contact and first layer electrical contact from all other respective components on said integrated circuit device;

interconnecting said respective electrical contacts into integrated circuits on said device; and forming output connectors on said device and connecting said integrated circuits to said output connectors.

13. The process of claim 12 further including:

forming a least one further layer on said second layer prior to forming said base contact region;

patterning said further layer with a pattern for said base contact regions;

forming said base contact regions through said pattern; and forming said electrical contacts to said base contact regions through said pattern.

14. The process of claim 13 further including:

patterning said further layer with additional metallization patterns;

forming metallization runs in conjunction with forming said electrical contacts to said base contact regions; and covering both of said metallization runs and said base contact region electrical contacts with a dielectric material.

15. A process of forming bipolar transistors and integrated circuit devices which utilize these bipolar transistors which comprises:

forming a gallium arsenide collector layer on a substrate;

ion implanting a base region in a portion of said collector layer;

annealing said base region;

forming a gallium aluminum arsenide layer over said collector layer including said implanted base region in said collector layer;

forming a gallium arsenide contact layer over said gallium aluminum arsenide layer;

forming a patterning layer over said gallium arsenide contact layer and patterning said patterning layer for a base contact region which surrounds an emitter region;

forming a base contact region in said gallium arsenide contact layer and said gallium aluminum arsenide layer through said patterning layer such that said base contact region extends through both of these respective layers into said base region and makes electrical contact to said base region and defines said emitter region in said gallium aluminum arsenide and gallium arsenide contact layers such that said emitter is isolated by said base contact region from the remainder of gallium aluminum arsenide and gallium arsenide contact layers, forming on the surface of said contact layer through said pattern in said patterning layer a base ohmic contact to said base contact region;

forming through said pattern in said patterning layer a dielectric layer over said base ohmic contact;

removing portions of said patterning layer defining said emitter;

forming an emitter ohmic contact to said emitter on the surface of said contact layer utilizing said dielectric layer on said base ohmic contact as a self aligning mask for said emitter ohmic contact;

patterning said patterning layer with a window for a collector contact; and forming a collector ohmic contact on the surface of said contact layer through said patterning layer wherein said collector ohmic contact is in electrical isolation from said emitter and conducts to said collector through said gallium aluminum arsenide and said gallium arsenide contact layers.

16. A process of forming bipolar transistors and integrated circuit devices which utilize these bipolar transistors which comprises:

forming a gallium arsenide collector layer on a substrate;

ion implanting a base region in a portion of said collector layer;

annealing said base region;

forming a gallium aluminum arsenide layer over said collector layer including said implanted base region in said collector layer;

forming a gallium arsenide contact layer over said gallium aluminum arsenide layer;

forming a silicon dioxide layer over said gallium arsenide contact layer;

forming an aluminum layer over said silicon dioxide layer;

patterning said aluminum layer and said silicon dioxide layers for a base contact region which surrounds an emitter region;

undercutting said silicon dioxide layer with respect to said aluminum layer;

forming a base contact region in said gallium arsenide contact layer and said gallium aluminum arsenide layer through said patterned aluminum and silicon dioxide layers such that said base contact region extends through both of said gallium arsenide and said gallium aluminum arsenide layers into said base region and makes electrical contact to said base region and defines an emitter in said gallium aluminum arsenide and gallium arsenide contact layers which is isolated by said base contact region from the remainder of gallium aluminum arsenide and gallium arsenide contact layers, forming on the surface of said contact layer through said pattern in said patterning layer a base ohmic contact to said base contact region;

removing said aluminum layer;

forming a trench zone around said base ohmic contact through said silicon dioxide layer;

forming through said pattern in said silicon dioxide layer a dielectric layer over said base ohmic contact including forming said dielectric layer in said trench zone;

removing portions of said silicon dioxide layer defining said emitter;

forming an emitter ohmic contact to said emitter on the surface of said contact layer utilizing said dielectric layer on said base ohmic contact as a self aligning mask for said emitter ohmic contact;

patterning said silicon dioxide layer with a window for a collector contact; and forming a collector ohmic contact on the surface of said contact layer through said silicon dioxide layer wherein said collector ohmic contact is in electrical isolation from said emitter and conducts to said collector through said gallium aluminum arsenide and said gallium arsenide contact layers.

17. A process of forming a bipolar transistor on a substrate which has an active first layer thereon which comprises:

implanting a base region in a portion of said first layer;

forming a second layer over said first layer including said implanted base region in said first layer;

forming a silicon dioxide layer over said second layer;

forming an aluminum layer over said silicon dioxide layer;

patterning said aluminum layer and said silicon dioxide layers for a base contact region which surrounds an emitter, said pattern for said base contact region formed as a window which surrounds an aluminum-silicon dioxide layered island;

forming a base contact region in said second layer through said patterned aluminum and silicon dioxide layers such that said base contact region extends through said second layer into said base region and makes electrical contact to said base region and defines said emitter below said island in said second layer;

forming on the surface of said contact layer through said pattern in said patterned aluminum and silicon dioxide layers a base ohmic contact to said base contact region;

removing said aluminum layer including the aluminum layer of said island;

forming a dielectric layer over said base ohmic contact through said pattern in said silicon dioxide layer and over the remainder of said silicon dioxide layer including said silicon dioxide layer of said island;

overlaying a resist on said silicon dioxide layer including laying said resist over said base ohmic contact;

etching said resist to expose said island over said emitter and to maintain said resist over said base ohmic contact;

removing said silicon dioxide layer of said island through said resist;

forming on the surface of said second layer an electrical contact to said emitter; and forming on the surface of said second layer in electrical isolation from said emitter an electrical contact to said second layer which electrically conducts to said first layer through said second layer.

18. A process of forming a bipolar transistor on a Group III–Group V semiconductor substrate comprising:

forming an active first layer thereon implanting a dopant into a base region in a portion of said first layer;

annealing said base region to remove damage sites resulting from the implantation;

forming a second active layer over said first layer including said implanted base region in said first layer;

forming a patterning layer over said silicon dioxide layer;

patterning said patterning layer for a base contact region which surrounds an emitter, said pattern for said base contact region formed as a window which surrounds an island;

forming a base contact region in said second layer through said patterning layer such that said base contact region extends through said second layer into said base region and makes electrical contact to said base region and defines said emitter below said island in said second layer;

forming on the surface of said contact layer through said patterning layer a base ohmic contact to said base contact region;

forming a dielectric layer over said base ohmic contact through said pattern in said patterning layer;

overlaying a resist on said patterning layer including laying said resist over said base ohmic contact;

etching said resist to expose said island over said emitter and to maintain said resist over said base ohmic contact;

removing the island portion of said patterning layer through said resist;

forming on the surface of said second layer an electrical contact to said emitter; and forming on the surface of said second layer in electrical isolation from said emitter an electrical contact to said second layer which electrically conducts to said first layer through said second layer.

* * * * *